United States Patent [19]

Livshits et al.

[11] Patent Number: 5,561,265
[45] Date of Patent: Oct. 1, 1996

[54] INTEGRATED CIRCUIT PACKAGING

[75] Inventors: Boris I. Livshits, Nepean; Kevin E. Harpell, Ottawa, both of Canada

[73] Assignee: Northern Telecom Limited, Montreal, Canada

[21] Appl. No.: 318,063

[22] Filed: Oct. 4, 1994

Related U.S. Application Data

[63] Continuation of Ser. No. 37,049, Mar. 25, 1993, abandoned.
[51] Int. Cl.⁶ .................................................. H05K 9/00
[52] U.S. Cl. .................................. 174/35 GC; 257/659; 261/818
[58] Field of Search ........................... 174/32, 35 R, 174/35 MS, 35 GC, 52.1–52.4; 361/816, 818; 257/659; 250/505.1, 506.1, 515.1

[56] References Cited

U.S. PATENT DOCUMENTS

| | | | |
|---|---|---|---|
| 4,218,578 | 8/1980 | Olschewski et al. | 174/35 R |
| 4,371,742 | 2/1983 | Manly | 174/35 MS X |
| 4,459,680 | 7/1984 | Sukeda et al. | 365/1 |
| 4,539,433 | 9/1985 | Ishini et al. | 174/35 MS |
| 4,622,527 | 11/1986 | Carlson | 364/424 X |
| 4,661,888 | 4/1987 | Jewell et al. | 361/424 |
| 4,754,101 | 6/1988 | Stickney et al. | 174/35 R |
| 4,796,079 | 1/1989 | Hettiger | 357/68 |
| 5,043,534 | 8/1991 | Mahulikar et al. | 174/52.4 |
| 5,110,651 | 5/1992 | Massard et al. | 174/35 MS X |
| 5,153,379 | 10/1992 | Guzuk et al. | 174/35 R |
| 5,159,294 | 10/1992 | Ishikawa et al. | 174/52.1 X |
| 5,166,772 | 11/1992 | Soldner et al. | 174/35 R X |
| 5,175,613 | 12/1992 | Barker, III et al. | 174/35 GC X |
| 5,182,427 | 1/1993 | McGaffin | 219/10.75 |
| 5,206,459 | 4/1993 | Aldissi | 174/36 |
| 5,206,620 | 4/1993 | Watanabe et al. | 336/84 M |
| 5,225,969 | 7/1993 | Takaya et al. | 361/414 |
| 5,252,782 | 10/1993 | Cantrall et al. | 174/35 R |
| 5,270,488 | 12/1993 | Ono et al. | 174/35 R |

Primary Examiner—Kristine L. Kincaid
Assistant Examiner—Christopher Horgan
Attorney, Agent, or Firm—Angela C. de Wilton

[57] ABSTRACT

A package is provided for an integrated circuit comprising a dielectric body enclosing the integrated circuit chip having a plurality of conductive terminal members extend through the dielectric body. The dielectric body includes a magnetic shielding layer for shielding electromagnetic radiation from the integrated circuit. The magnetic shielding layer comprises a material having a high magnetic permeability and a high resistivity, so that the dielectric body absorbs electromagnetic radiation at frequencies generated by the integrated circuit and thereby attenuates electromagnetic emissions from the integrated circuit. Suitable materials having a high dielectric constant and high magnetic permeability include ferrites. Conveniently a shielding layer of ferrimagnetic material comprising a ferrite plate may be applied to surfaces of a conventional plastic or ceramic packaging material. Alternatively, ferrite particles may be incorporated into binder to form a composite material suitable for forming into an IC package. The magnetic nature of the shielding provides that a non-conductive dielectric package may significantly attenuate and suppress electromagnetic interference generated by an enclosed IC. Further to provide effective electromagnetic shielding for a large apparatus, individual packages may be customized to provided shielding to particular integrated circuit chips with higher emissions, thereby reducing the total cost of shielding an electronic system or apparatus.

18 Claims, 3 Drawing Sheets

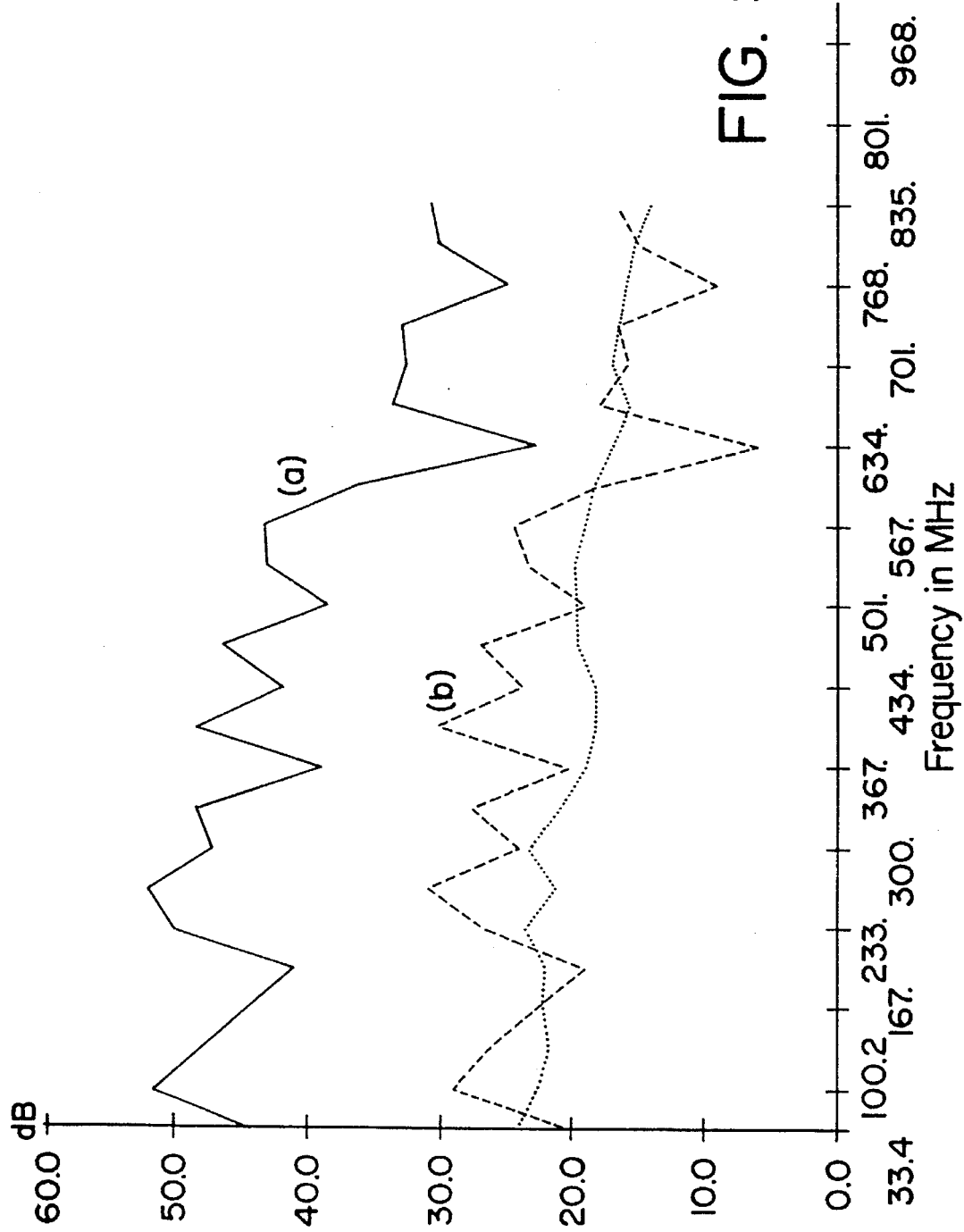

INTEGRATED CIRCUIT PACKAGING

This application is a continuation of application Ser. No. 08/037,049, filed Mar. 25, 1993, now abandoned.

FIELD OF THE INVENTION

This invention relates to an integrated circuit package and an assembly of a package and integrated circuit.

BACKGROUND OF THE INVENTION

Active components of electronic systems, i.e. integrated circuits (ICs), such as microprocessors, controllers, ASICS (application specific ICs) and other microelectronic devices, are a source of unwanted radiated electromagnetic emissions which may cause electromagnetic interference (EMI). To prevent interference, radiated emissions from equipment must be controlled to meet various regulatory requirements and standards. Control of undesirable electromagnetic emissions may add significant cost to an electronic system. Suppression of radiated emissions may be accomplished at the system level, by providing a shielded enclosure for an apparatus, or by enclosing parts of the apparatus, e.g. a circuit board, in a shielded housing. In an example described in U.S. Pat. No. 4,661,888 to Jewell, entitled "Removable modular housing for RF circuits" issued 28 Apr. 87, a circuit board is enclosed in a grounded metal, i.e. aluminium, casing. However, in many applications grounded metal enclosure or housing of this type is bulky, uneconomical and impractical for maintenance purposes.

As described in U.S. Pat. No. 4,459,680 to Sukeda issued July 1984, entitled "Magnetic Bubble memory cassette" EMI shielding is provided in the form of a ferromagnetic enclosure. Sukeda shows a packaged integrated circuit with associated components mounted on a printed circuit board (PCB), with a shield plate, comprising a sheet of iron or permalloy (0.5 to 0.3 mm thick) which surrounds a fully operational device and the substrate supporting it, that is, a circuit board and connectors. Use of electrically conductive shielding materials, including ferromagnetic metals and alloys, which. rely on an electro-conductive effect for their shielding, requires that the grounded shielding layer is sufficiently spaced from other conductors, such as terminal pins of the enclosed IC package and the conductive traces on the PCB, to prevent unwanted electrically conductive paths or shorts. Thus, the shielding plates may substantially increase the size of the packaged component, and may increase thermal stress by reducing heat dissipation.

Conventional packages for integrated circuits are formed from dielectric materials, typically, plastic or ceramic materials, which provide physical and environmental protection of the enclosed chip, but provide little or no attenuation of electromagnetic emission generated during operation of the enclosed circuit. Thus, improved circuit design and layout is used to achieve suppression at the source of radiation, e.g. from the integrated circuit itself. However, this solution may add to circuit design complexity and cost, or compromise performance.

Alternatively, additional components on a circuit board, such as filters, chokes, decoupling capacitors, etc., are required to reduce or control electromagnetic emissions.

SUMMARY OF THE INVENTION

The present invention seeks to provide attenuation of undesirable electromagnetic radiation from sources such as integrated circuits and other microelectronic devices, which avoids or reduces the above mentioned problems.

Thus according to one aspect of the present invention there is provided a package for an integrated circuit, comprising: a dielectric body defining a chamber for supporting therein an integrated circuit and having electrically conductive terminal members extending through the dielectric body to an exterior of the body, and the dielectric body providing magnetic means for shielding electromagnetic radiation, said shielding means comprising a magnetic material having a high magnetic permeability to radiation at selected frequencies generated by operation of the integrated circuit, whereby the body attenuates electromagnetic emissions generated by operation of the integrated circuit.

Thus a package for an integrated circuit is provided in which the body of the package is not only a dielectric, that is, has a high resistivity and is thus electrically non-conductive, but also has magnetic properties whereby it functions as a magnetic means for shielding electromagnetic radiation. Preferably, the dielectric body of the package comprises electromagnetic radiation shielding means in the form of a magnetic material with high magnetic permeability, (and low magnetic impedance) to radiation generated by operation of the integrated circuit. Thus, the magnetic material absorbs or attenuates electromagnetic emission from an enclosed integrated circuit. For example, where the magnetic material is substantially non-conductive, the magnetic shielding means may conveniently be provided in the form of an exterior cladding or barrier layer of the body formed from the magnetic material.

Where the magnetic shielding barrier layer forms an exterior cladding of the package, suitable materials for the barrier layer include ferrimagnetic materials, for example, ferrites. Ferrites are materials which are both good dielectrics and have a high magnetic permeability. Electromagnetic radiation is attenuated or absorbed primarily by a magnetic effect, rather than an electro-conductive effect. In magnetic materials having a low magnetic impedance, magnetic fields are concentrated inside the ferrimagnetic material, thus reducing the radiated emissions outside the package. The advantage of using an electrically non-conductive magnetic material for magnetic shielding is that it may be located in close proximity, or even in contact with, integrated circuit terminal pins, where it will tend to absorb conducted emission noise from the pins. A reduction of 10 dB to 15 dB in the radiated emission from an integrated circuit can be realized when a integrated circuit package is formed with a body comprising a conventional dielectric material such as an organic resin or a ceramic material and a thin plate or layer of commercially available ferrite material provided on exterior surfaces to form a barrier or shielding layer for electromagnetic radiation. The resulting reduction in electromagnetic radiation noise allows hardware designers to relax the EMC requirements on the PCB structure and layout and reduce or eliminate EMC components on the PCB.

In a practical way of providing ferrimagnetic shielding on one or more faces of a conventional type of IC package, an IC package is formed of a conventional dielectric packaging material, e.g. a ceramic material or plastic, which is laminated with a sheet or plate of ferrite material. A conventional package may thus be provided with a magnetic shielding layer. A ground connection to the magnetic shielding layer is not required, because attenuation of electromagnetic radiation occurs by a magnetic effect, rather than an electro-conductive effect.

Advantageously, the whole body of the package may form the magnetic shielding means when it comprises a suitable known non-conductive, high resistivity, magnetic shielding material, for example a ferrite which may be suitably processed or moulded. Thus, preferably, the ferrimagnetic shielding forms the dielectric body of the package which surrounds and encloses the chip. The magnetic shielding may then contact the electrically conductive terminal pins of the package, without causing undesirable shorting.

Alternatively, the magnetic shielding means takes the form of particles of a suitable ferrimagnetic or ferromagnetic material dispersed within a matrix of a dielectric material forming the body of the package. Thus, for example, the body of the package may comprise a dielectric matrix of an organic resin in which is dispersed particles of a ferromagnetic or ferrimagnetic material. The latter may include, as an example, particles of a ferrimagnetic material such as a ferrite, in a resin binder. Alternatively, known ferromagnetic metals or alloys such as iron, cobalt, nickel, and mixtures thereof and which may be conductive, may be used, if the particles are surrounded, and thereby isolated, in a matrix of a dielectric material.

According to another aspect of the present invention, there is provided a package for a microelectronic device, comprising: a dielectric body defining a chamber for supporting therein a microelectronic device and having electrically conductive terminal members extending therethrough, and the dielectric body providing magnetic means for shielding electromagnetic radiation, said shielding means comprising a magnetic material having a high magnetic permeability at selected frequencies generated by operation of the microelectronic device, whereby the body attenuates electromagnetic emissions generated by operation of the microelectronic device.

According to yet another aspect of the invention there is provided an assembly of a microelectronic device and a package, the package comprising a dielectric body enclosing the microelectronic device, the package having a plurality of electrically conductive terminal members extending through the dielectric body of the package and electrically connected with the microelectronic device, and the dielectric body providing magnetic means for shielding electromagnetic radiation, said magnetic shielding means comprising a material having a high magnetic permeability at selected frequencies of radiation generated by operation of the microelectronic device, whereby the body is substantially electrically non-conductive and attenuates electromagnetic emission generated by operation of the enclosed microelectronic device.

According to further aspect of the invention there is provided a packaged integrated circuit comprising: an integrated circuit chip and a package comprising a dielectric body enclosing the integrated circuit chip, the package comprising electrically conductive terminal members electrically connected to the integrated circuit and extending through the dielectric body to an exterior of the body, and the dielectric body also providing magnetic means for shielding electromagnetic radiation, said magnetic shielding means comprising a material having a high magnetic permeability to electromagnetic radiation comprising selected frequencies generated by operation the integrated circuit, whereby radiated electromagnetic emission from the integrated circuit is attenuated by the body.

Conveniently, where a package comprises a conventional dielectric substrate member and a cover member, the magnetic shielding means may comprise a cladding of a layer of a ferrite material forming one or more exterior faces of the cover or substrate of package.

According to yet a further aspect of the invention, there is provided a method of attenuating electromagnetic emission from integrated circuits comprising: selectively providing individual integrated circuits with a package including a dielectric body having magnetic means for shielding electromagnetic radiation, the magnetic shielding means comprising a magnetic material having a high resistivity and a high magnetic permeability at frequencies generated by operation of the enclosed integrated circuit, whereby electromagnetic emission from operation the integrated circuit is attenuated by the dielectric body of the package.

Since individual integrated circuits or other active microelectronic devices may be individually shielded in customized shielded packages provided according to the invention, individual ICs which are the major sources of electromagnetic interference in an electronic apparatus may be shielded selectively. Thus the requirements for a shielded housing for the whole apparatus may be avoided or reduced, with consequent cost savings.

Thus the present invention provides a package for an integrated circuit, a package for a microelectronic device, and an assembly of a package and an integrated circuit, and a method of attenuating electromagnetic radiation from an electronic apparatus, in which the above mentioned problems are avoided or reduced.

BRIEF DESCRIPTION OF THE DRAWINGS

Embodiments of the invention will now be described by way of example, with reference to the accompanying drawings, in which:

FIG. 5 shows a graph of the intensity of electromagnetic radiation as a function of frequency for a integrated circuit chip packaged a) in a conventional plastic package and b) in a package according to the first embodiment of the invention.

DESCRIPTION OF THE PREFERRED EMBODIMENT

Figure 1:
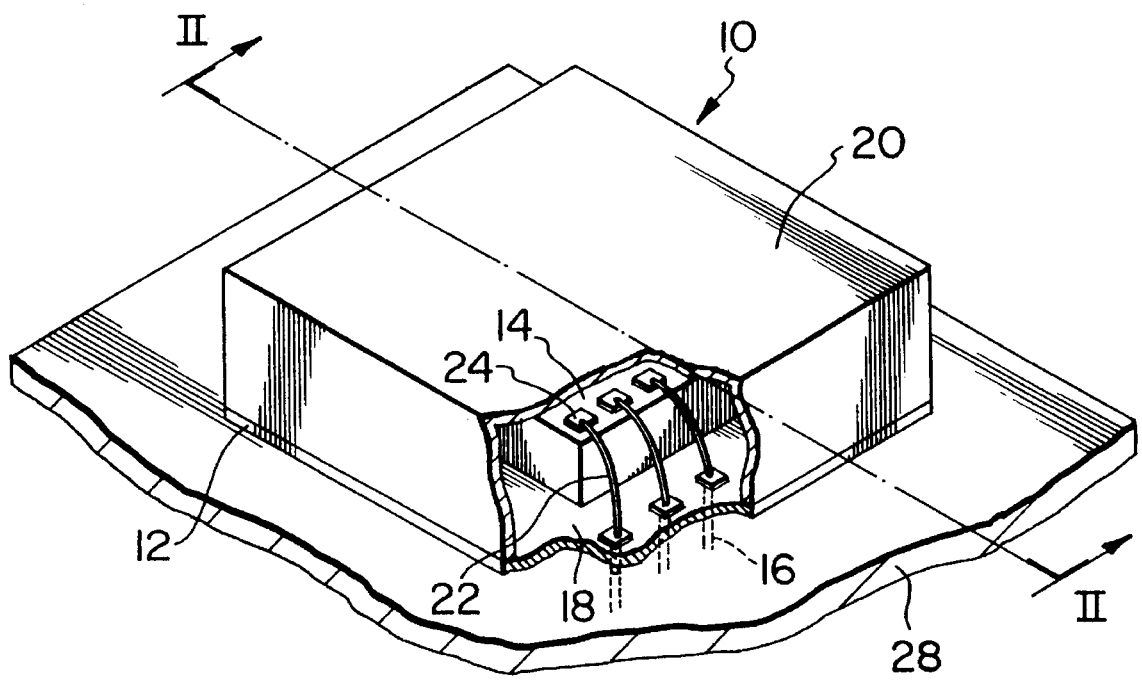
FIG. 1 shows a cut away perspective view of a conventional integrated circuit package.

A conventional known type of (prior art) package 10 for an integrated circuit (IC) die 14 is shown schematically in FIG. 1. The package 10 comprises a body 12 formed of a plastic (that is, an organic resin) or ceramic material. The package functions to protect the integrated circuit die 14 from external stresses and contamination and the package provides suitable external electrically conductive terminal members in the form of terminal pins 16. A lower part of the body 18 forms a substrate for supporting the chip and an upper part of the body 20 forms a cover of the package. The external connector pins 16 are connected by conventional wirebonding of lead wires 22 to bond pads 24 on the IC. The conductors thus extend from the chip through the body of the package to provide for I/O connections to external circuitry on a PCB 28.

Figure 2:
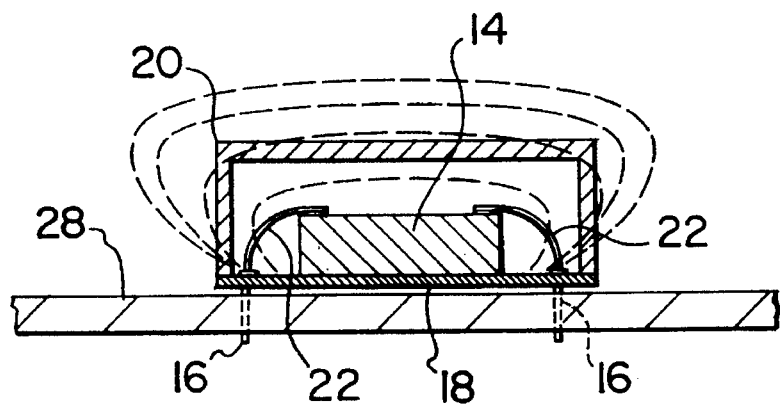
FIG. 2 shows a cross sectional view through the conventional integrated circuit package of FIG. 1 along arrows II—II showing radiated electromagnetic field lines during operation of the enclosed integrated circuit.

Since the plastic or ceramic dielectric materials used for body 12 of a conventional IC package has no electromagnetic shielding properties, any radiation from the source, i.e. generated by devices on the enclosed IC 14, passes substantially unattenuated through the body 12 of the package as shown schematically by the radiated field lines in FIG. 2. Generally, although there may be some radiation from the terminal pins, the major source of radiation from a packaged IC is radiation directly from components on the IC, as shown. In wire bonded ICs, radiation is dependent on the structure and length of the wire bonds. Radiation is emitted from both the front and back surfaces of a chip, although when the chip is packaged and mounted on a single layer PCB, as shown in FIG. 2, the amount of radiation emitted from the surface facing away from the PCB may be greater.

In an integrated circuit package 50 according to a first embodiment of the present invention, the package has a similar form to the package of the prior art, in having a dielectric body 52 enclosing the integrated circuit and comprising a substrate member 54 supporting the integrated circuit die 60 and a cover member 56. The integrated circuit die 60 is connected to external electrically conductive terminal pins 62 by conductors in the form of lead wires 64 which are wire bonded to a bond pad 66 on the IC die 60. However, the body 52 of the package differs from a conventional package in being provided with a magnetic means for shielding electromagnetic radiation comprising a barrier layer 70 of a material having a high magnetic permeability for radiation generated by operation of the enclosed integrated circuit. The barrier layer 70 comprises from a magnetic material which also has a high resistivity, that is, is electrically non-conductive, for example, laminar plates or tiles of a ferrite material which are adhesively fixed to exterior surfaces of the cover member 56 and substrate member 54 of the package. The ferrite layer 70 functions to absorb or attenuate electromagnetic emission from the IC. A suitable ferrimagnetic material which is commercially available in thin plates, is manufactured by Fair-Rite Products Corporation and has a magnetic permeability μ in the range 850–3000 H/m and saturation magnetic flux density ($B_s$) of 2750 Gauss. The minimum thickness of sheet material available is 1.5 mm.

By way of example, using a ceramic pin grid array (PGA) type package or a plastic package carrying a Motorola 2B1Q chip MC 145472A or Motorola microprocessors (88100 or 68000) generating emissions in the frequency range 30 MHz to 900 MHz, a thin plate of approximately 2 mm thickness of a ferrimagnetic material was provided on outer surfaces of the chip package. Electromagnetic, emission from the chip was attenuated by 10 dB to 15 dB (FIG. 5) compared with a conventional unshielded package. While some radiation is carried and radiated by the terminal pins, the overall emission is significantly reduced by the magnetic shielding 70 of the package. Thus, lamination plates of ferrite material to surfaces of a conventional ceramic or plastic package is a simple and cost effective way of obtaining improved EMC.

Thin plates of ferrite material may be applied satisfactorily to one or more exterior surfaces of existing known ceramic packages without significantly interfering with attachment to a circuit board. However, when greater attenuation is required, and this cannot be achieved without unacceptably increasing the thickness of the package by application of a thicker plates of ferrite to the cover or substrate, a package according to an second embodiment of the invention may be employed, as described below.

Figure 3:
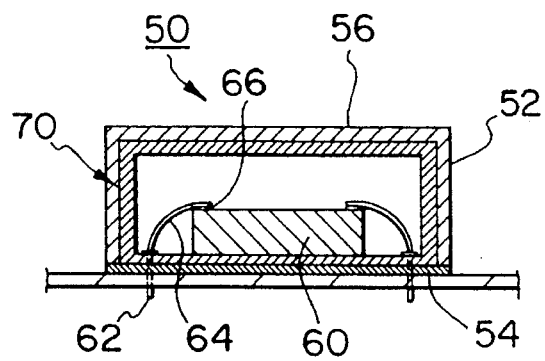
FIG. 3 shows a schematic cross sectional view through an integrated circuit package according to a first embodiment of the present invention.
Figure 3A:
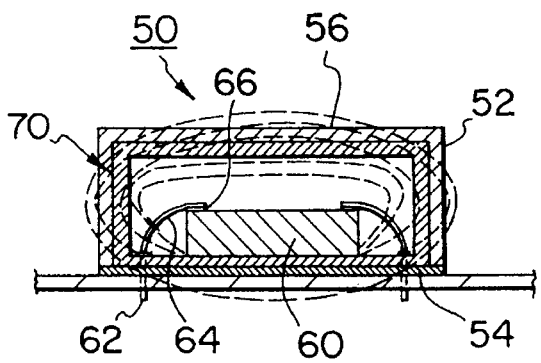
FIG. 3A shows the radiated field lines during operation of the integrated circuit.
Figure 4:
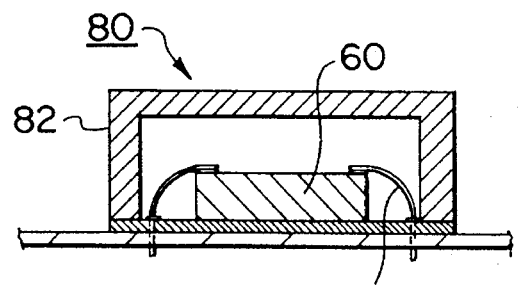
FIG. 4 shows a schematic cross sectional view through an integrated circuit package according to a second embodiment of the present invention.
Figure 4A:
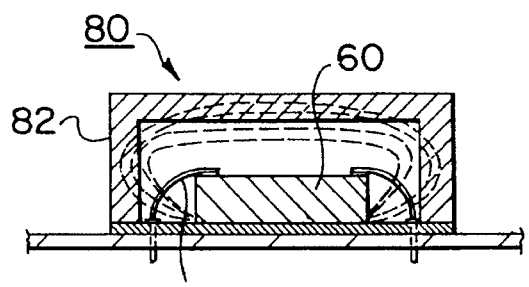
FIG. 4A shows the radiated field lines during operation of the integrated circuit.

In an integrated circuit package according to a second embodiment, the package 80 as shown in FIG. 4, is similar to that shown FIG. 3, except that the body 82 of the package material is formed from a dielectric material which comprises a ferrimagnetic particles of a selected ferrite material in a matrix of a dielectric material. Thus the whole body of the package forms a magnetic shielding layer enclosing the integrated circuit chip and contacting the terminal pins. A suitable material for forming the package comprises a paste of ferrimagnetic material in binder, cured at normal temperature. Such materials can be moulded and/or otherwise processed like conventional plastic or ceramic materials for IC packaging.

The thermal resistance of the ferrite material is similar to that of conventional ceramic packaging materials and a ferrite cladding on the package does not significantly degrade the thermal performance of the package. Like ceramics, ferrites generally have higher thermal conductivity than plastics. A ferrite package may in fact improve thermal management compared with a conventional plastic package.

Typically, frequency ranges of electromagnetic emission from integrated circuits which are of concern for EMI in telecommunications applications are in the range from 1 MHz to 1 GHz. Frequency dependence of the magnetic properties of ferromagnetic vs. ferrimagnetic materials may be significantly different at higher frequencies, e.g. 1 GHz and over.

In modifications of the first embodiment, alternative ferrite or ferrimagnetic materials may be selected to provide attenuation of radiation in a predetermined frequency range, the material and thickness of the magnetic shielding layers being selected to give an appropriate amount of attenuation.

Typically, ferrites have high resistivities, in the range $(1-10) \times 10^6$ Ω m, and a saturation magnetization, $B_{(s)}$, which is lower than for ferromagnetic materials. Well known ferrites include manganese and zinc [Mn—Zn] ferrite and nickel and zinc (Ni—Zn) ferrite. Typically, ferrites include materials of the group $(MO)(Fe_2O_3)$ (where M is a metal), which may be formed by mixing powdered iron oxide, metal oxide and firing the mixture which sinters into a spinel crystal structure. Mechanically, ferrites are have ceramic like characteristics, are brittle, and may be formed into plates with low mechanical strength. However composite materials which may be moulded or otherwise processed like plastic or conventional ceramic packaging materials may be formed comprising particles of ferrite materials in a binder or matrix of an organic resin.

A ferrimagnetic material may alternatively be applied as a thin coating formed from a slurry of ferrite particles in a binder which is cured to form a cladding forming on surfaces of a conventional ceramic package.

In another modification of the embodiments, not shown, a magnetic shielding layer comprising a ferrimagnetic material is incorporated into the dielectric body of a multichip module (MCMs) to provide shielding of a plurality of chips within the module.

In another embodiment, a magnetic shielding means is provided by a dielectric body comprising a dielectric matrix incorporating isolated particles of ferromagnetic materials. Well known ferromagnetic elements comprise, for example, Fe, Ni, Co, Mn, and alloys thereof. In U.S. Pat. No. 4,371,742 to Manly entitled "EMI suppression from transmission lines" issued 1 Feb. 1983, the characteristics of a number of magnetic materials incorporating ferromagnetic particles in a resin to form flexible coating for metal shielded transmission lines are described. However, shielding characteristics of ferromagnetic composites are frequency dependent on the particle size of the ferromagnetic particles.

In electronic systems incorporating a plurality of packaged chips mounted on circuit boards or other substrates, selective shielding of individual integrated circuits, or other microelectronic devices, in packages comprising magnetic shielding means according an embodiment of the invention may eliminate or relax the requirement for providing a shielded housing or other electromagnetic emission control for the whole system.

Although particular embodiments of the invention have been described in detail, it should be appreciated that numerous modifications, variations na dadaptations may be made without departing from the scope of the invention as defined in the claims.

What is claimed is:

1. An assembly of a microelectronic device and a package, the package comprising a dielectric body enclosing the microelectronic device, with a plurality of electrically conductive members extending through the dielectric body to an exterior of the package and electrically connected with the microelectronic device, and the dielectric body comprising means for shielding electromagnetic radiation consisting of a non-conductive layer of a magnetic material forming at least part of the dielectric body, the non-conductive layer of magnetic material having a high magnetic permeability at selected frequencies of radiation generated by operation of the microelectronic device, and the non-conductive layer of magnetic material extending over the microelectronic device for attenuating electromagnetic emission through the dielectric body radiated from the microelectronic device.

2. An assembly according to claim 1 wherein the microelectronic device comprises an integrated cirtuit.

3. An assembly according to claim 1 wherein the non-conductive layer of magnetic material comprises a ferrite.

4. An assembly according to claim 1 wherein the non-conductive layer of magnetic material comprises a layer of ferrimagnetic material.

5. An assembly according to claim 1 wherein the non-conductive layer of magnetic material comprises a plate of ferrite material forming an exterior cladding of the dielectric body.

6. An assembly according to claim 1 wherein the non-conductive layer of magnetic material comprises particles of ferrimagnetic material supported in a matrix of a dielectric material forming the dielectric body.

7. An assembly according to claim 1 wherein the non-conductive layer of magnetic material comprises particles of ferromagnetic material dispersed in a matrix of a dielectric material forming the dielectric body.

8. A packaged integrated circuit comprising:

an integrated circuit chip and a package comprising a dielectric body enclosing the integrated circuit chip, and electrically conductive terminal members electrically connected to the integrated circuit chip and extending through the dielectric body to an exterior of the dielectric body, the dielectric body comprising means for shielding electromagnetic radiation consisting of a non-conductive layer of a magnetic material forming at least part of the dielectric body, the non-conductive layer of magnetic material having a high magnetic permeability at selected frequencies of radiation generated by operation of the integrated circuit chip and the non-conductive layer of magnetic material extending over the integrated circuit chip for attenuating electromagnetic emission through the dielectric body radiated from the integrated circuit chip.

9. A packaged integrated circuit according to claim 8 wherein the dielectric body comprises a substrate member supporting the integrated circuit chip and a cover member, and the non-conductive layer of magnetic material is provided by a cladding of a ferrite material laminated on an exterior surface of at least one of the cover member and the substrate member.

10. A packaged integrated circuit according to claim 9 wherein the cover member and substrate member define a chamber enclosing the integrated circuit chip.

11. A method of attenuating electromagnetic emission from an electronic apparatus including a plurality of packaged integrated circuits, comprising:

selectively shielding an individual integrated circuit of the plurality of integrated circuits with a package including a dielectric body by providing at least part of the dielectric body with magnetic means for shielding electromagnetic radiation consisting of a non-conductive layer of magnetic material having a high resistivity and a high magnetic permeability at frequencies generated by operation of the enclosed individual integrated circuit, electromagnetic emission through the dielectric body radiated from the individual integrated circuit being attenuated by the non-conductive layer of magnetic material extending over the integrated circuit.

12. A method according to claim 11 wherein the non-conductive layer of magnetic material comprises a ferrite material and said ferrite material is provided as a covering of the dielectric body.

13. A package for an integrated circuit, comprising:

a dielectric body cooperable with a substrate for enclosing therein an integrated circuit with electrically conductive terminal members extending from the integrated circuit to an exterior of the dielectric body, and the dielectric body comprising electromagnetic radiation shielding means consisting of a non-conductive layer of a magnetic material forming at least part of the dielectric body, the non-conductive layer of magnetic material having a high magnetic permeability to electromagnetic radiation at frequencies generated by operation of the integrated circuit and the non-conductive layer of magnetic material extending over the integrated circuit for attenuating electromagnetic emission through the dielectric body radiated from the integrated circuit.

14. A package according to claim 13 wherein the non-conductive layer of magnetic material forms an exterior cladding layer of the dielectric body.

15. A package according to claim 13 wherein the non-conductive layer of magnetic material comprises a ferrite and forms an exterior cladding layer of the dielectric body.

16. A package according to claim 13 wherein the non-conductive layer of magnetic material comprises a ferrimagnetic material having a high resistivity and the dielectric body is formed from said ferrimagnetic material.

17. A package according to claim 16 wherein the ferrimagnetic material comprises ferrite particles dispersed in an organic resin matrix.

18. A package according to claim 16 wherein the ferrimagnetic material comprises ferrite particles dispersed in a ceramic matrix.

* * * * *